United States Patent [19]
Hirano et al.

[11] Patent Number: 5,530,289
[45] Date of Patent: Jun. 25, 1996

[54] SEMICONDUCTOR DEVICE AND METHOD OF MANUFACTURING THE SAME

[75] Inventors: Naohiko Hirano; Kazuhide Doi, both of Kawasaki, Japan

[73] Assignee: Kabushiki Kaisha Toshiba, Kawasaki, Japan

[21] Appl. No.: 286,165

[22] Filed: Aug. 5, 1994

[30] Foreign Application Priority Data

Oct. 14, 1993 [JP] Japan ................................. 5-280617

[51] Int. Cl.$^6$ ................................. H01L 23/34
[52] U.S. Cl. ................................. 257/723; 257/70
[58] Field of Search ................................. 257/685, 686, 257/669, 676, 674, 701, 723, 724

[56] References Cited

U.S. PATENT DOCUMENTS 5,332,921  7/1994  Dousen et al. ................. 257/723

FOREIGN PATENT DOCUMENTS 61-24253  2/1986  Japan ................. 257/685

*Primary Examiner*—Sara W. Crane
*Assistant Examiner*—S. V. Clark
*Attorney, Agent, or Firm*—Finnegan, Henderson, Farabow, Garrett & Dunner

[57] ABSTRACT

A semiconductor device includes a rectangular wiring substrate and a plurality of semiconductor elements having connecting electrodes such as projecting electrodes connected to the wiring substrate. Even though the wiring substrate is deformed, the semiconductor elements and connecting electrodes are prevented from being broken, thereby maintaining the reliability of the semiconductor device for a long period of time. A buffer region constituted by grooves is formed in that middle part of the undersurface of the rectangular wiring substrate which is located between both the long sides of the wiring substrate and between both the short sides thereof. The semiconductor elements are formed outside the buffer region. The connecting electrodes of the semiconductor elements are connected to a wiring pattern on the surface of the wiring substrate, with the result that the semiconductor elements are mounted on the wiring substrate. The deformation of the buffer region absorbs a deformation of that part of the wiring substrate which is located near the semiconductor elements mounted on the wiring substrate thereby to protect the semiconductor elements.

10 Claims, 5 Drawing Sheets

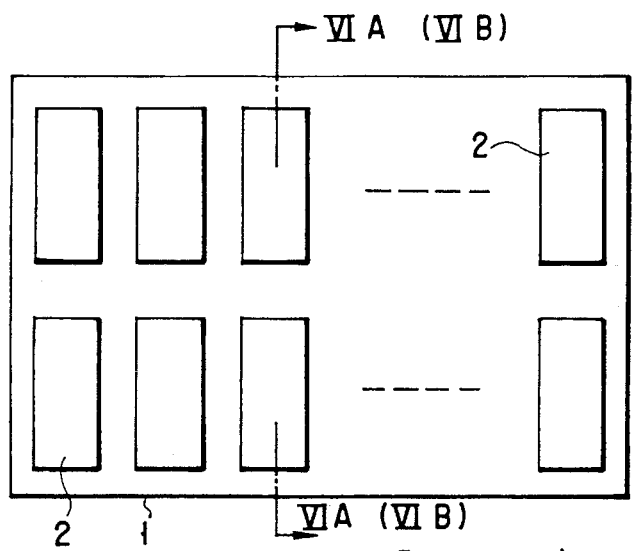
F I G. 5A
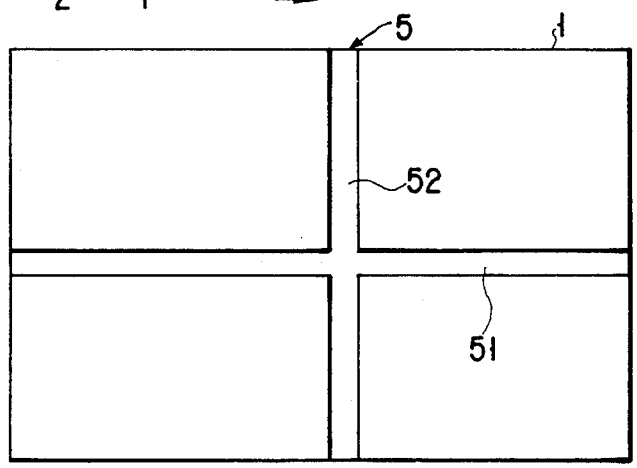
F I G. 5B
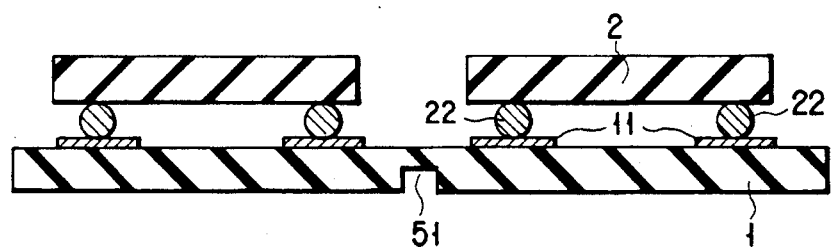
F I G. 6A
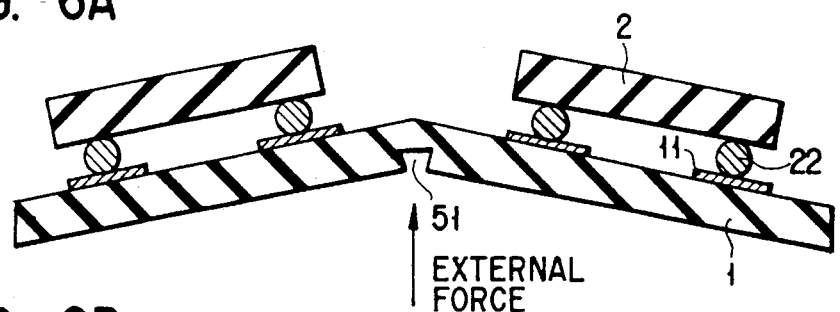
F I G. 6B

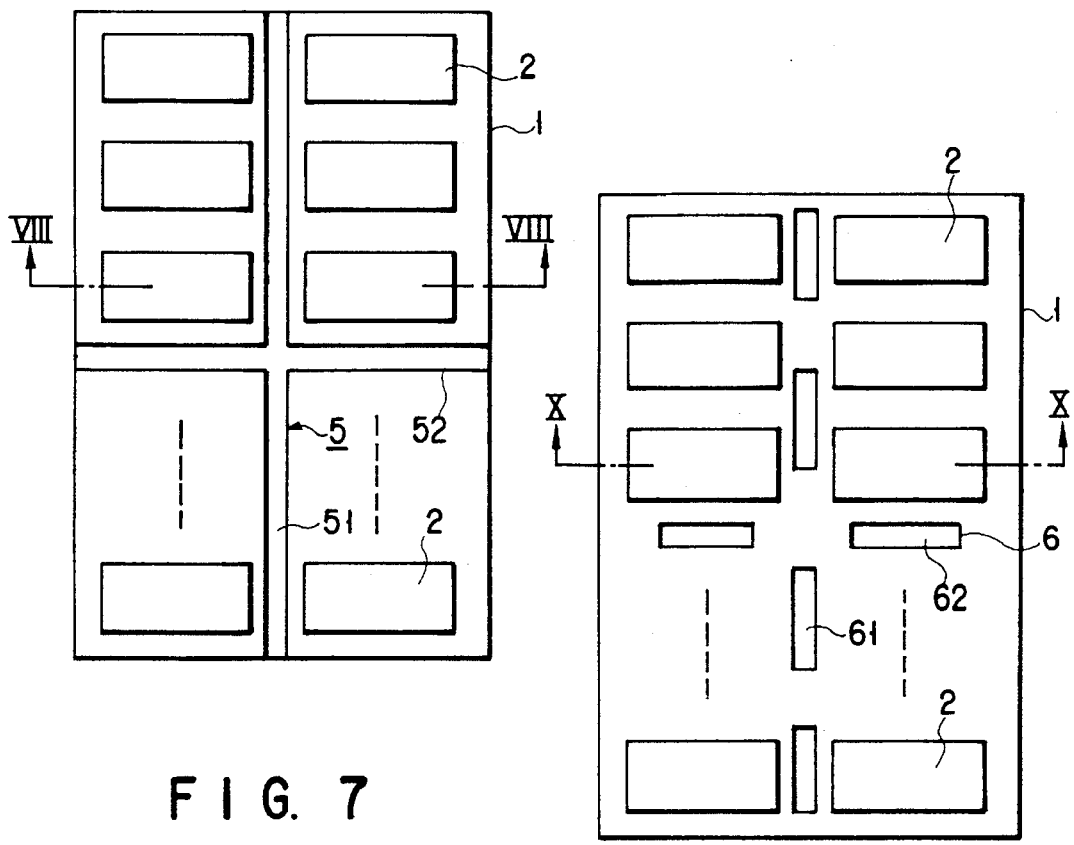
FIG. 7
FIG. 9
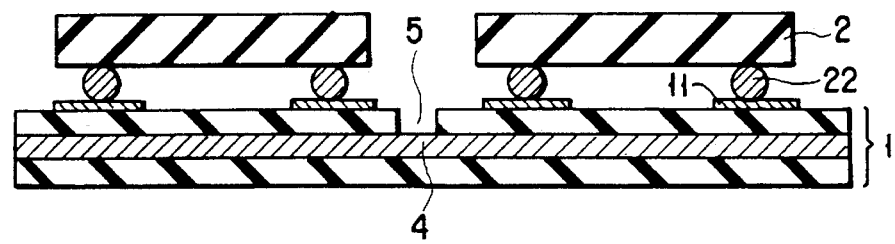
FIG. 8
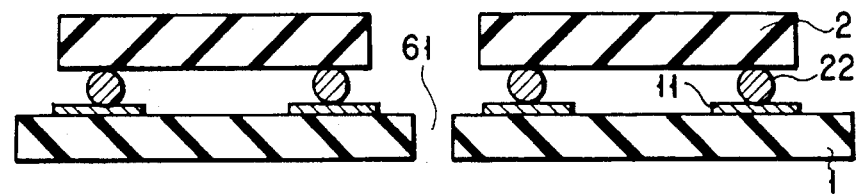
FIG. 10

5,530,289

SEMICONDUCTOR DEVICE AND METHOD OF MANUFACTURING THE SAME

BACKGROUND OF THE INVENTION

1. Field of the Invention

The present invention relates to a semiconductor device and, more specifically, to a structure of a wiring substrate on which a plurality of semiconductor elements having connecting electrodes such as projecting electrodes are mounted and which is capable of moderating an unpredictable deformation due to external force or impact.

2. Description of the Related Art

A semiconductor device is generally constituted by a plurality of semiconductor elements each including an IC, an LSI, or like formed on a semiconductor substrate, and a wiring substrate on which the semiconductor elements are mounted. The semiconductor elements are packaged by using a package of synthetic resin, ceramic, etc. in order to protect them from mechanical destruction and contaminations such as dust, chemical, gas, and moisture that adversely affect the characteristics of the semiconductor substrate. To mount a semiconductor element on the wiring substrate, conventionally, a lead attached to the semiconductor element by means of a lead frame, is connected to a circuit pattern of a wiring layer of the wiring substrate. Recently, the semiconductor devices have been used versatilely, and the density of semiconductor elements mounted on a wiring substrate has been increased. Furthermore, a thin wiring substrate of 1 mm or less has recently been used for a memory card, and the number of memory elements mounted on the memory card tends to increase.

FIGS. 1, 2A and 2B show a conventional card type semiconductor device such as a memory card. The semiconductor device includes a plurality of semiconductor elements 2 each constituted by a resin package having a semiconductor substrate on which an integrated circuit is formed, and the semiconductor elements 2 each have leads 21 electrically connected to the integrated circuit and extending outside the resin package. The semiconductor elements 2 are mounted on a wiring substrate 10. The leads 21 of the semiconductor elements 2 are laid on a circuit pattern of a wiring layer 11 formed on the surface of the wiring substrate 10 to be connected with the wiring layer by solder or the like. If external force or impact is exerted on the wiring substrate 10 mounted with the semiconductor elements 2, in the direction of an arrow shown in FIG. 2B, the substrate 10 is deformed, and stress is generated at connecting portions between the semiconductor elements 2 and wiring substrate 10. The thinner the wiring substrate, the greater the deformation and stress. Since, however, the relatively long leads 21 are interposed between the semiconductor elements 2 and wiring substrate 10, the stress is absorbed by deformation of the leads 21, and the reliability of the connecting portions is maintained. In the card type semiconductor device such as a memory card, the thickness of the wiring substrate is decreased more and more, and the mounting density is improved.

There is a limit to the conventional semiconductor elements in improving the mounting density, since the leads greatly project from the semiconductor elements. For this reason, as shown in FIGS. 3, 4A and 4B, the semiconductor elements 2 have projecting electrodes 22 and are mounted on the wiring substrate 10. More specifically, a plurality of projecting electrodes 22 constituted by, e.g., solder are formed on the surface of the wiring substrate 10, and each electrically connected to the integrated circuit (not shown) therein. The projecting electrodes 22 are placed on the circuit pattern of the wiring layer 11 formed on the surface of the wiring substrate 10, and connected to the wiring layer by pressure and heating. The height of each projecting electrode 22 is 100 μm or less, and connecting electrodes such as bump electrodes, each of which has a greater width relative to the height thereof, are used as the projecting electrodes. If external force or impact is exerted on the wiring substrate 10 mounted with the semiconductor elements 2, in the direction of an arrow shown in FIG. 4B, the substrate 10 is deformed, and stress is generated at connecting portions between the semiconductor elements 2 and wiring substrate 10. The thinner the wiring substrate, the greater the deformation. The stress causes the semiconductor element 2 to be broken as indicated by numeral 30 of FIG. 4B, and causes the projecting electrode 22 to be separated from the wiring substrate 10 as indicated by numeral 40 of FIG. 4B.

The structure of the semiconductor device shown in FIGS. 3, 4A and 4B is effective in increasing the semiconductor elements mounted on the wiring substrate and making the wiring substrate thinner. If, however, the external force is applied to the substrate in the direction indicated by the arrow of FIG. 4B, the semiconductor substrate is broken (30) or separated (40) from the wiring substrate, since it does not have any equivalents for those package leads of the semiconductor device shown in FIGS. 1, 2A and 2B which absorb the deformation of the wiring substrate. In particular, the card type semiconductor device is thinned more and more. The thinner the device is, the more easily it is deformed. In a portable device such as a memory card, its reliability is inevitably degraded because of unpredictable external force or impact exerted on the device.

SUMMARY OF THE INVENTION

The present invention has been developed in consideration of the above situation, and its object is to provide a semiconductor device such as a memory card which moderates an unpredictable deformation due to external force or impact and prevents a brake from occurring on semiconductor elements or projecting electrodes to maintain the reliability of the device for a long period of time, and a method of manufacturing the semiconductor device.

A semiconductor device according to the present invention is characterized in that a wiring substrate mounted with a plurality of semiconductor elements each having projecting electrodes includes a buffer region for absorbing a deformation due to external force or impact. The semiconductor device comprises a wiring substrate, a plurality of semiconductor elements mounted on the wiring substrate by connecting electrodes and electrically connected to a wiring layer of the wiring substrate, and a buffer region formed on the wiring substrate, for absorbing a deformation of the wiring substrate. It is desirable to form the buffer region in a part of the wiring substrate which is easy to be deformed. It is also desirable to form the buffer region in a non-element region between the semiconductor elements on the wiring substrate. It is desirable that the wiring substrate is substantially rectangular, and the buffer region includes first and second grooves, the first groove extending to both short sides of the wiring substrate in substantially parallel to long sides of the wiring substrate and being formed in substantially a middle part between the long sides, and the second groove extending to both the long sides of the wiring substrate in substantially parallel to the short sides thereof and being formed in substantially a middle part between the short sides.

The semiconductor elements can be mounted on both the surface and undersurface of the wiring substrate. A method of manufacturing a semiconductor device comprises arranging a plurality of insulating substrates separately from one another on a same plane; layering a plurality of insulating substrates each having a size larger than a size of each of the arranged insulating substrates, on the arranged insulating substrates, a wiring layer being formed on a surface of each of the layered insulating substrates and serving as a surface layer; heating, while pressing, the arranged insulating substrates and the layered insulating substrates, on each other to provide a wiring substrate on a surface of which the wiring layer of an uppermost one of the layered insulating substrates is formed, having a groove serving as a buffer region between the arranged insulating substrates; electrically connecting the wiring layer formed on the uppermost insulating substrate to the wiring layers formed on the surfaces of the other layered insulating substrate; and mounting connecting electrodes of a plurality of semiconductor elements to the wiring substrate to electrically connect the plurality of semiconductor elements to the wiring layer formed on the uppermost insulating substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 5A and 5B are plan views respectively showing patterns of the surface and undersurface of a wiring substrate of a semiconductor device according to one embodiment of the present invention;

FIGS. 6A and 6B are cross-sectional views taken along the line VIA—VIA and the line VIB—VIB of FIG. 5A, respectively;

FIG. 7 is a plan view showing a pattern of the surface of a wiring substrate of a semiconductor device according to another embodiment of the present invention;

FIG. 8 is a cross-sectional view taken along the line VIII—VIII of FIG. 7;

FIG. 9 is a plan view showing a pattern of the surface of a wiring substrate of a semiconductor device according to still another embodiment of the present invention;

FIG. 10 is a cross-sectional view taken along the line X—X of FIG. 9;

DETAILED DESCRIPTION OF THE PREFERRED EMBODIMENTS

Figure 1:
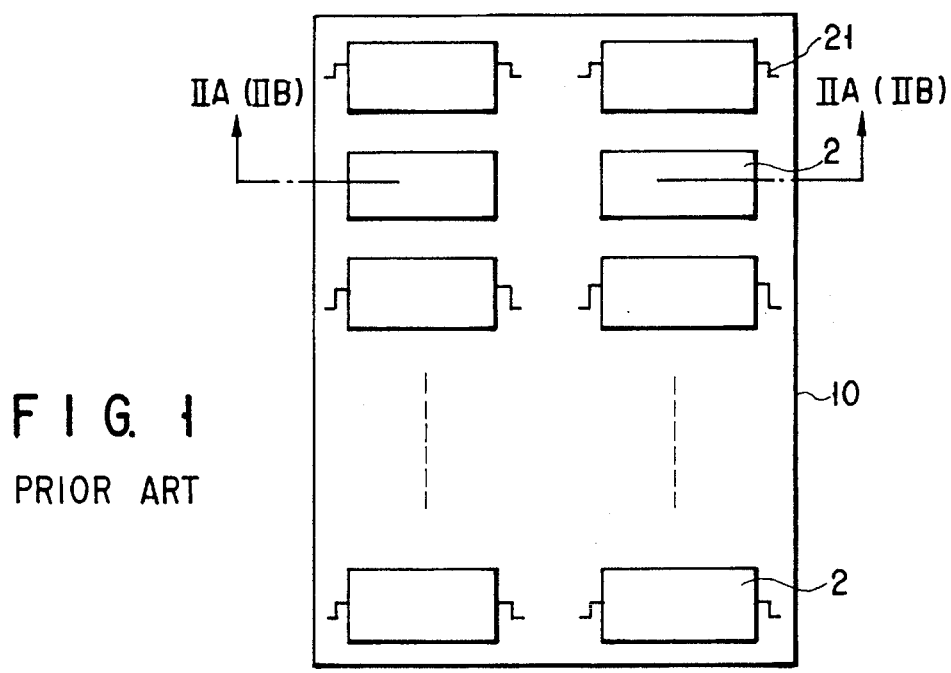
FIG. 1 is a plan view showing a pattern of the surface of a wiring substrate of a conventional semiconductor device.
Figure 2A:
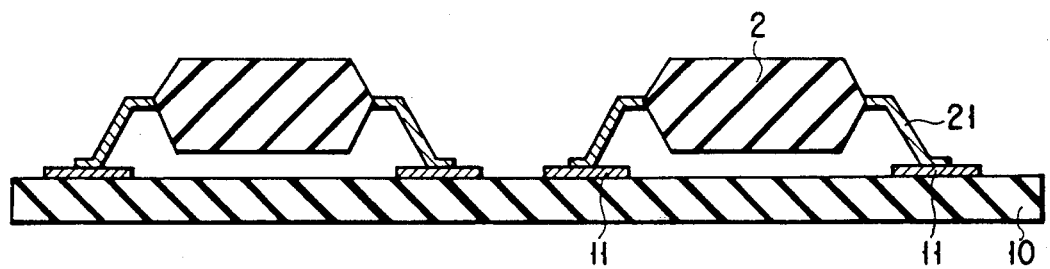
FIGS. 2A and 2B are cross-sectional views taken along the line IIA—IIA and the line IIB—IIB of FIG. 1, respectively.
Figure 2B:
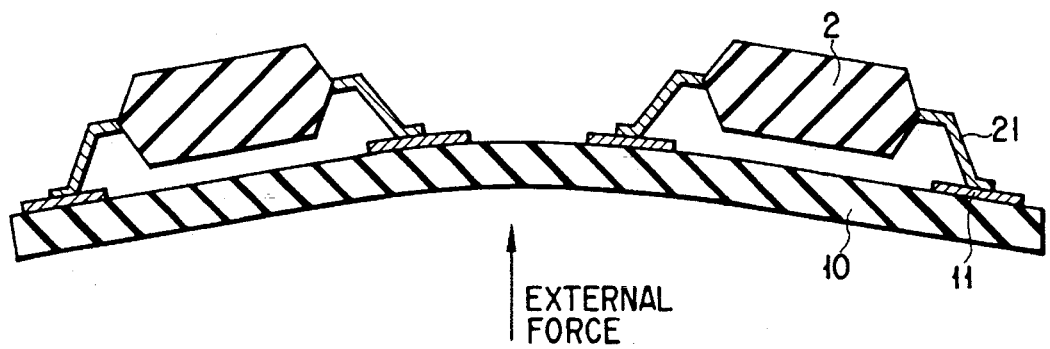
Figure 3:
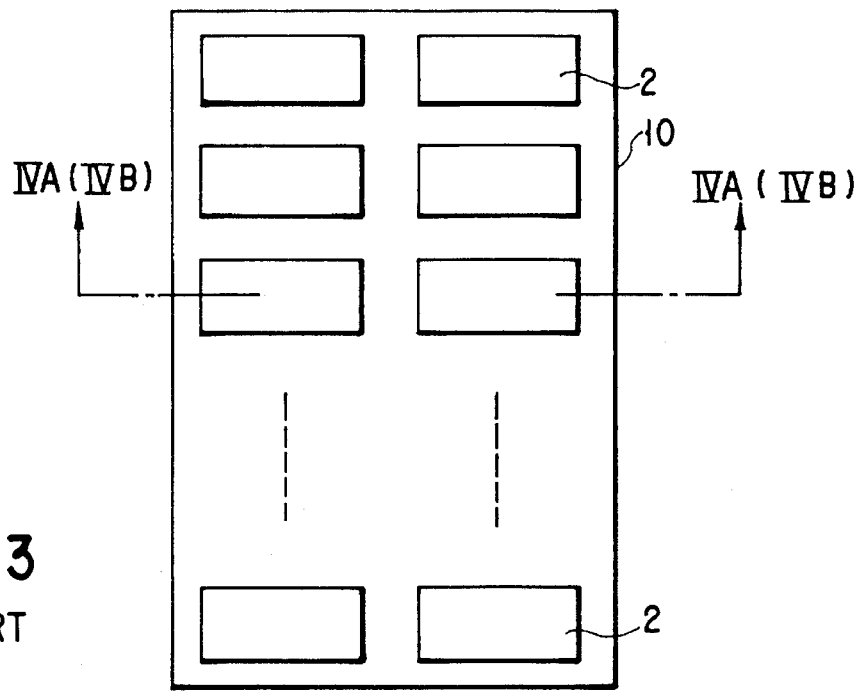
FIG. 3 is a plan view showing a pattern of the surface of another wiring substrate of the conventional semiconductor device.
Figure 4A:
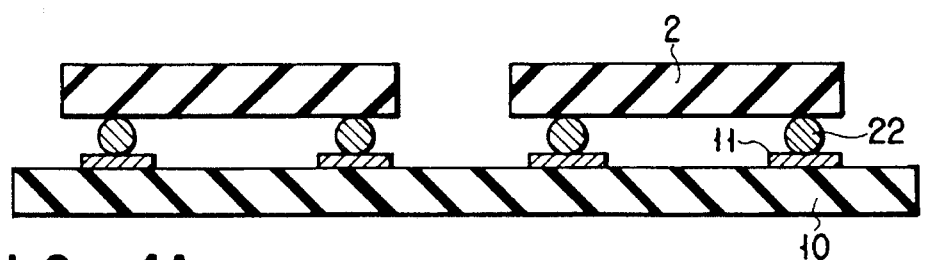
FIGS. 4A and 4B are cross-sectional views taken along the line IVA—IVA and the line IVB—IVB of FIG. 3, respectively.
Figure 4B:
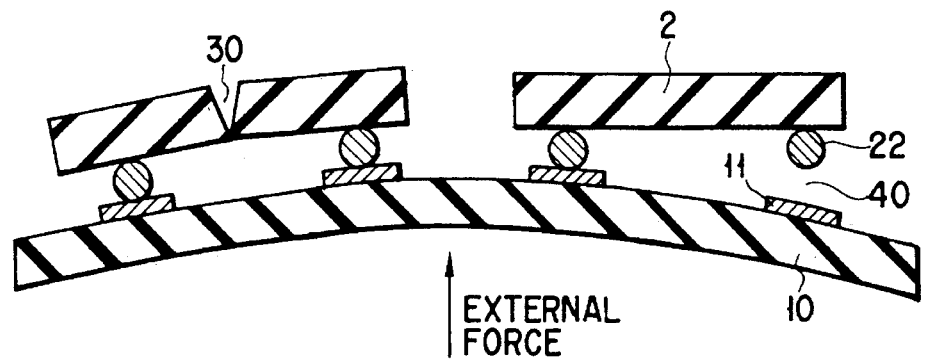

Embodiments of the present invention will be described, with reference to the accompanying drawings.

First a card type semiconductor device according to a first embodiment of the present invention will now be described, with reference to FIGS. 5A, 5B, 6A and 6B. FIGS. 5A and 5B are plan views showing patterns of the surface and undersurface of a wiring substrate 1 of the semiconductor device, and FIGS. 6A and 6B are cross-sectional views taken along the line VIA—VIA and the line VIB—VIB of FIG. 5A, respectively. In these figures, a group of terminals attached to the wiring substrate are not shown. Semiconductor elements 2 are mounted on the surface of the wiring substrate 1 (FIG. 5A) and have connecting electrodes 22 (FIG. 6A) such as projecting electrodes which are electrically connected to integrated circuits (not shown) arranged inside a semiconductor substrate. The wiring substrate 1 is, for example, rectangular and its thickness is about 1 mm. The connecting electrodes 22, which are constituted by, e.g., solder, is laid on the circuit pattern of a wiring layer 11 formed on the surface of the wiring substrate 1, and connected to the wiring layer 11 by melting the connecting electrodes 22.

A groove 5 including first groove 51 and second groove 52 is formed in the undersurface of the wiring substrate 1 (FIG. 5B). The proper depth of the groove 5 is about ⅒ to ⅕ the thickness of the wiring substrate 1. In the first embodiment, for example, the depth is about 0.1 mm (which is about ⅒ the thickness of the wiring substrate). The first groove 51 extends to both of the short sides of the wiring substrate 1 along the long sides thereof and is formed in substantially a middle part between the long sides. Similarly, the second groove 52 extends to both of the long sides of the wiring substrate 1 along the short sides thereof and is formed in substantially a middle part between the short sides. Needless to say, the thickness of a part of the wiring substrate 1 in which the groove 5 is formed, is smaller than that of the other part thereof. The former part of the wiring substrate 1, which is cut in the thickness direction of the substrate 1, serves as a buffer region. Since the semiconductor device of the first embodiment is used for a memory card, the semiconductor elements are constituted by semiconductor memories. The buffer region is formed on neither an element mounting region of the wiring substrate 1 on which the semiconductor elements are mounted nor its corresponding region of the undersurface thereof. The buffer region has to be formed on a non-element region on which no semiconductor elements are mounted. The buffer region is therefore formed between the semiconductor elements mounted on the wiring substrate. Assuming that the buffer region is formed in the element mounting region, when the wiring substrate is deformed in the buffer region, the semiconductor elements in the buffer region receive a stress, with the result that the elements are broken or the electrodes are separated from the wiring substrate. It is desirable to form the buffer region in that portion of the wiring substrate which is easy to be deformed by external force or impact. This portion is substantially parallel to the long or short sides of the rectangular wiring substrate, and it is more desirable to form it in the middle part between both the long sides or between both the short sides. However, the position of the buffer region is not limited to the above.

It is advantageous to form the buffer region in as large non-element region as possible in order to exclude the semiconductor elements from around the buffer region. As shown in FIG. 6B, if external force or impact is applied to the wiring substrate 1 on which the semiconductor elements 2 are mounted, in the direction of the arrow, the wiring substrate is deformed, with the result that stress is exerted on the connecting portions of the wiring substrate 1 and semiconductor elements 2. As the wiring substrate 1 is thinned, the deformation becomes greater and so does the stress. Since, however, the grooves of the buffer regions are formed in substantially the middle parts of the wiring substrate 1 which are parallel to the long and short sides thereof, respectively, they absorb the stress. Thus, the reliability in connection of the wiring substrate 1 and semiconductor elements 2 can be maintained.

As described above, the projecting electrodes 22 are laid on the circuit pattern of the wiring layer 11 formed on the surface of the wiring substrate 1, and connected to the wiring layer by pressure and heating. The height of each projecting electrode 22 is 100 µm or less. Connecting electrodes, which are greater in width relative to height, are used as the projecting electrodes. Unlike in the first embodiment, the number of grooves parallel to the short sides of the wiring substrate 1 need not be limited to one (groove 52). Two or more grooves can be formed between the semiconductor elements 2.

A semiconductor device according to a second embodiment of the present invention will now be described, with reference to FIGS. 7 and 8. FIG. 7 is a plan view showing a pattern of the surface of a wiring substrate of the semiconductor device, and FIG. 8 is a cross-sectional view taken along the line VIII—VIII of FIG. 7. In these figures, a group of terminals attached to the wiring substrate are not shown. As in the first embodiment, semiconductor elements 2 are mounted on the surface of the wiring substrate 1 (FIG. 7). The wiring substrate 1 is, for example, rectangular, and its thickness is about 1 mm. Connecting electrodes 22 are constituted by projecting electrodes of the semiconductor elements 2 generally including solder, and placed on the circuit pattern of a wiring layer 11 formed on the surface of the wiring substrate 1. Thus the connecting electrodes 22 are connected to the wiring layer by soldering or the like. Unlike in the first embodiment, a groove 5 including first groove 51 and second groove 52 is formed on the surface of the wiring substrate 1 mounted with the semiconductor elements 2. The proper depth of the groove 5 is about 1/10 to 1/5 the thickness of the wiring substrate 1. The first groove 51 extends to both of the short sides of the wiring substrate 1 substantially in parallel to the long sides of the substrate 1, and is located in substantially a middle part between the long sides. Similarly, the second groove 52 extends to both of the long sides substantially in parallel to the short sides, and is located in substantially a middle part between the short sides. A part of the wiring substrate 1, which corresponds to the groove 5 and is cut in the thickness direction of the wiring substrate, serves as a buffer region.

A multilayer wiring layer 4 is formed in the wiring substrate 1, and electrically connected to the circuit pattern of the wiring layer of the substrate 1, thereby electrically connecting the semiconductor elements mounted on the substrate 1. In the second embodiment, as shown in FIG. 8, the multilayer wiring layer 4 can be formed within the buffer region and is exposed to the bottom surface of the groove 5. The multilayer wiring layer 4 can be flexibly constituted by, for example, a polyimide film and a copper wiring layer. Since, in this case, the wiring layer 4 is flexible, it can be hardly cut or broken even if the buffer region is deformed.

A semiconductor device according to a third embodiment of the present invention will now be described, with reference to FIGS. 9 and 10. FIG. 9 is a plan view showing a pattern of the surface of a wiring substrate of the semiconductor device, and FIG. 10 is a cross-sectional view taken along the line X—X of FIG. 9. In these figures, a group of terminals attached to the wiring substrate are not shown. Like in the preceding embodiments, semiconductor elements 2 are mounted on the surface of, e.g., a rectangular wiring substrate 1 (FIGS. 9 and 10). Connecting electrodes 22 are constituted by projecting electrodes of the semiconductor elements 2 generally including solder, and laid on the circuit pattern of a wiring layer 11 formed on the surface of the wiring substrate 1. Thus the connecting electrodes 22 are connected to the wiring layer by soldering or the like. In the third embodiment, the grooves 5 of the first and second embodiments are replaced with a plurality of slits 6 including slits 61 and slits 62 on the surface of the wiring substrate 1 mounted with the semiconductor elements 2. The slit 6 is formed in the same location as those of the grooves 5 of the first and second embodiments. If a wiring layer such as a multilayer wiring layer is formed in the wiring substrate, the slits have to be formed in a region other then the wiring layer.

The slits 61 are arranged substantially in parallel to the long sides of the rectangular substrate 1 and located in substantially a middle part between the long sides. The line of these slits extends to near both of the short sides of the wiring substrate 1. The slits 62 are arranged substantially in parallel to the short sides of the substrate 1 and located in substantially a middle part between the short sides. The row of the slits 62 extends to near both of the long sides of the substrate 1. The part of the wiring substrate 1 corresponding to the slit 6 (61, 62) serves as a buffer region. If there are too many slits, the mechanical strength of the substrate 1 is lowered. It is thus necessary to form the slits in consideration of the strength of the wiring substrate. The location or the number of the slits is not limited to the third embodiment.

The slits can be replaced with through-holes which are not particularly different from the slits in operation and advantage. Since the opening area of the through-hole is smaller than that of the slit, it can be formed even in that small region between semiconductor elements where no wiring layer is formed, thereby increasing the degree of freedom to select the location at which the buffer region can be formed.

Figure 11:
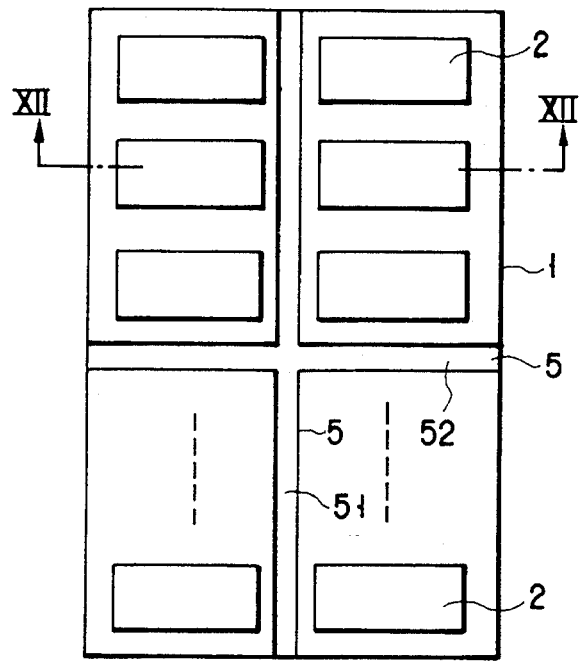
FIG. 11 is a plan view showing a pattern of the surface of a wiring substrate of a semiconductor device according to yet another embodiment of the present invention.
Figure 12:
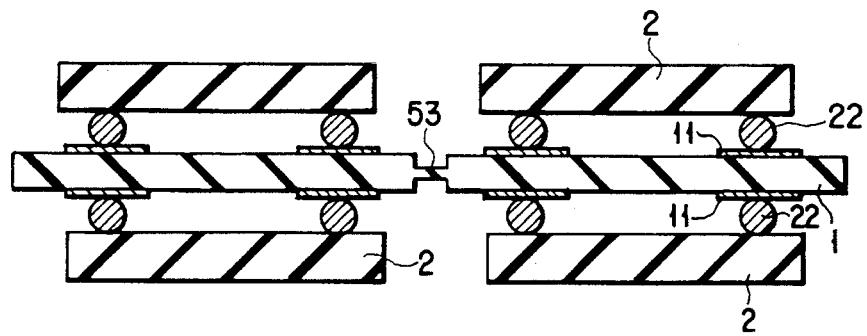
FIG. 12 is a cross-sectional view taken along the line XII—XII of FIG. 11.

A semiconductor device according to a fourth embodiment of the present invention will now be described, with reference to FIGS. 11 and 12. FIG. 11 is a plan view showing a pattern of the surface of a wiring substrate of the semiconductor device, and FIG. 12 is a cross-sectional view taken along the line XII—XII of FIG. 11. In these figures, a group of terminals attached to the wiring substrate are not shown. The feature of this semiconductor device lies in that semiconductor elements 2 are mounted not only on the surface of a wiring substrate 1 but also on the undersurface thereof, and grooves of buffer regions are formed on both the surface and undersurface of the substrate 1. The wiring substrate 1 is, for example, rectangular, and its thickness is about 1 mm. Connecting electrodes 22 are constituted by projecting electrodes of the semiconductor elements 2 generally including solder, and placed on the circuit pattern of wiring layers 11 formed on the surface and undersurface of the wiring substrate 1. Thus the connecting electrodes 22 are connected to the wiring layers by soldering or the like. In the fourth embodiment, grooves 5 each including grooves 51 and 52, are formed on the surface and undersurface of the wiring substrate 1 mounted with the semiconductor elements 2. As shown in FIG. 12, the grooves are formed on both the surface and undersurface of the wiring substrate 1 to constitute a buffer region, and a thin portion 53 corresponding to the buffer region is formed in substantially the middle part of the wiring substrate in its thickness direction. Therefore, the wiring substrate can be deformed in every direction by the external force or impact, unlike in the case where a groove is formed on only one of the surface and undersurface of the wiring substrate.

Since the semiconductor elements 2 are mounted on both the surfaces of the wiring substrate 1, if it is applied to a memory card, its capacity is about twice as large as that of a wiring substrate whose one surface is mounted with semiconductor elements. The memory card is completed by covering the surface of the wiring substrate mounted with the semiconductor elements, with an insulating protection film. On either surface of the wiring substrate 1, the groove 51 extends to both short sides of the wiring substrate 1 in substantially parallel to the long sides thereof, and is located in substantially the middle part between the long sides. Similarly, the groove 52 extends to both the long sides in substantially parallel to the short sides, and is located in substantially the middle part between the short sides. The groove 5 including these grooves 51 and 52 serves as a buffer region. The semiconductor elements 2 mounted on one surface of the wiring substrate 1 and the semiconductor element 2 mounted on the other surface are electrically connected to each other through a multilayer wiring layer, for example. The multilayer wiring layer is electrically connected to the circuit patterns of the wiring layers formed on the surface and undersurface of the wiring substrate 1.

Figure 13:
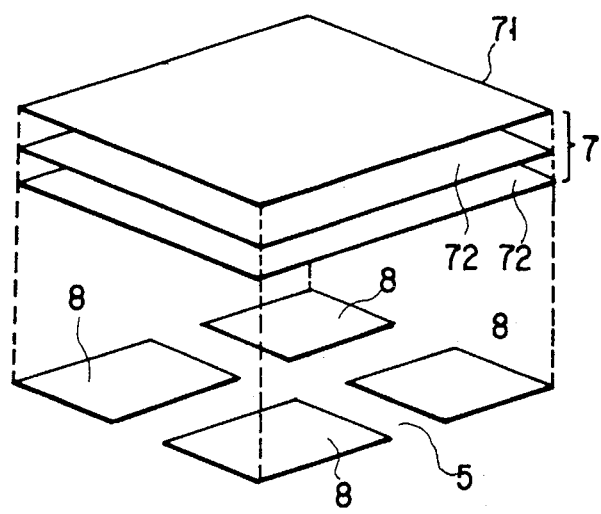
FIG. 13 is a cross-sectional view of a wiring substrate in one process of a method for manufacturing a semiconductor device according to another embodiment of the present invention.

A method for manufacturing a semiconductor device according to the present invention will now be described, with reference to FIG. 13. First, a plurality of insulating substrates 7 and 8 constituted by glass fibers including epoxy resin, are prepared. All the insulating substrates 7 are almost equal in size, and the insulating substrates 8 are almost equal in size and smaller than the substrates 7. In FIG. 13, four insulating substrates 8 each having no wiring layer thereon, are arranged on the same plane at regular intervals. The interval between the insulating substrates 8 corresponds to a groove 5 formed on the undersurface of the wiring substrate, which serves as a buffer region, when the wiring substrate is completed. The insulating substrate 7, which includes the uppermost insulating substrate (surface substrate) 71, the lowermost insulating substrate (undersurface substrate) 72, and an intermediate insulating substrate (intermediate substrate) 72, are arranged above the insulating substrates 8. A wiring layer is formed on each of the insulating substrates 7. The insulating substrates 7 and 8 are integrally formed as one component by heat under pressure, resulting in the wiring substrate 1 as shown in FIGS. 5A and 5B. The groove 5 is formed at the same time when the wiring substrate is formed. The wiring layer formed on the surface substrate 71 is electrically connected to the intermediate and undersurface substrates 72. In order to prevent the buffer region from being formed on the surface of the wiring substrate 1, a plurality of semiconductor elements 2 having projecting electrodes are connected to the circuit pattern of the wiring layer formed on the surface of the wiring substrate. By attaching the projecting electrodes to the wiring substrate 1, the semiconductor elements 2 mounted on the wiring substrate are electrically connected to each other.

In all the foregoing embodiments, the projecting electrodes are constituted by solder. However, they can be constituted by a metal conductive film of platinum, gold or the like formed on the surface of a ball of resin. The metal conductive film is not limited to platinum, nor is the ball limited to resin. The material of the wiring substrate is not limited to the glass fibers including epoxy resin. Ceramics such as alumina, synthetic resin, a combination of ceramics and synthetic resin, and the like can be used as the material of the wiring substrate. Even if the semiconductor elements are not rectangular but square, they can be arranged in place on the wiring substrate to form a buffer region in that part of the wiring substrate which is easy to be deformed. If both square and rectangular semiconductor elements are mounted on the wiring substrate, their locations are determined so that a buffer region can be formed in that part of the wiring substrate which is easy to be deformed.

The buffer region can be formed by properly combining the modes of the above embodiments, taking into consideration the density of semiconductor elements mounted on the wiring substrate.

In the above-described semiconductor device wherein a wiring substrate is mounted with a plurality of semiconductor elements having connecting electrodes such as projecting electrodes, and a buffer region formed in the wiring substrate absorbs an unpredictable deformation due to external force or impact to prevent a brake from occurring on the semiconductor elements or prevent the connecting electrodes from malfunctioning, thereby maintaining the reliability of the semiconductor device for a long period of time.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:

a wiring substrate;

a plurality of semiconductor elements mounted on said wiring substrate by connecting electrodes and electrically connected to a wiring layer of said wiring substrate; and a buffer region formed on said wiring substrate, including grooves extending from at least one side of said wiring substrate to an opposite side, said grooves having a depth sufficient to allow absorption of stress on said wiring substrate.

2. The semiconductor device according to claim 1, wherein said buffer region is formed in a part of said wiring substrate which is easily deformed.

3. The semiconductor device according to claim 1, wherein said buffer region is formed in a non-element region between said semiconductor elements on said wiring substrate.

4. The semiconductor device according to claim 1, wherein said wiring substrate is substantially rectangular, and said buffer region includes first and second grooves, said first groove extending to both short sides of said wiring substrate in substantially parallel to long sides of said wiring substrate and being formed in substantially a middle part between the long sides, and said second groove extending to both the long sides of said wiring substrate in substantially parallel to the short sides thereof and being formed in substantially a middle part between the short sides.

5. The semiconductor device according to claim 1, wherein said plurality of semiconductor elements are mounted on both a surface and an undersurface of said wiring substrate.

6. A semiconductor device comprising:

a wiring substrate;

a plurality of semiconductor elements mounted on said wiring substrate by connecting electrodes and electrically connected to a wiring layer of said wiring substrate; and a buffer region formed on said wiring substrate including a plurality of slits arranged from at least one side of said wiring substrate to an opposite side, each slit having a depth sufficient to allow absorption of stress on said wiring substrate.

7. The semiconductor device according to claim 6, wherein said buffer region is formed in a part of said wiring substrate which is easily deformed.

8. The semiconductor device according to claim 6, wherein said buffer region is formed in a non-element region between said semiconductor elements on said wiring substrate.

9. The semiconductor device according to claim 6, wherein said wiring substrate is substantially rectangular, and said buffer region includes first and second rows of slits, said first row of slits extending nearly to both of the short sides of said wiring substrate arranged substantially in parallel to the long sides of said wiring substrate and being formed in substantially a middle part between the long sides, and said second row of slits extending nearly to both of the long sides of said wiring substrate substantially in parallel to the short sides thereof and being formed in substantially a middle part between the short sides.

10. The semiconductor device according to claim 6, wherein said plurality of semiconductor elements are mounted on both a surface and an undersurface of said wiring substrate.

* * * * *